United States Patent
Yoon

(10) Patent No.: US 9,857,901 B2
(45) Date of Patent: Jan. 2, 2018

(54) DISPLAY DEVICE WITH TOUCH SENSOR HAVING PROTRUSIONS AND DEPRESSIONS

(71) Applicant: Samsung Display Co., Ltd., Yongin-si (KR)

(72) Inventor: Mi Jin Yoon, Deagu (KR)

(73) Assignee: Samsung Display Co., Ltd., Yongin-si (KR)

( * ) Notice: Subject to any disclaimer, the term of this patent is extended or adjusted under 35 U.S.C. 154(b) by 58 days.

(21) Appl. No.: 14/925,414

(22) Filed: Oct. 28, 2015

(65) Prior Publication Data

US 2016/0299610 A1    Oct. 13, 2016

(30) Foreign Application Priority Data

Apr. 8, 2015 (KR) .................. 10-2015-0049810

(51) Int. Cl.
*G06F 3/041* (2006.01)
*G06F 3/045* (2006.01)
*H01L 27/32* (2006.01)
*H01L 51/52* (2006.01)

(52) U.S. Cl.
CPC .......... *G06F 3/0412* (2013.01); *H01L 27/323* (2013.01); *H01L 51/5281* (2013.01); *G06F 2203/04103* (2013.01)

(58) Field of Classification Search
CPC ......... G06F 3/0412; G06F 2203/04103; G06F 3/044; H01L 51/5281; H01L 27/323
See application file for complete search history.

(56) References Cited

U.S. PATENT DOCUMENTS

| | | | |
|---|---|---|---|
| 2013/0278514 A1 | 10/2013 | Jeon et al. | |
| 2014/0048780 A1* | 2/2014 | Song | H01L 51/5253 257/40 |
| 2014/0065326 A1* | 3/2014 | Lee | G06F 1/16 428/12 |
| 2015/0109245 A1* | 4/2015 | Chou | G06F 3/044 345/174 |
| 2015/0160767 A1* | 6/2015 | Song | G06F 3/0412 345/174 |
| 2017/0033168 A1* | 2/2017 | Jeong | H01L 27/326 |

FOREIGN PATENT DOCUMENTS

| | | | |
|---|---|---|---|
| KR | 10-2011-0044030 | 4/2011 | |
| KR | 10-2013-0048611 | 5/2013 | |
| KR | 10-2013-0119256 | 10/2013 | |
| KR | 1020130048611 A * | 10/2013 | ............. G06F 3/044 |
| KR | 10-2014-0118955 | 10/2014 | |

* cited by examiner

*Primary Examiner* — Kwang-Su Yang
(74) *Attorney, Agent, or Firm* — H.C. Park & Associates, PLC

(57) ABSTRACT

A display device includes a display panel including a substrate, a display unit including a pixel and a non-pixel area disposed on the substrate, and an encapsulation layer covering the display unit, and a touch sensor including detection electrodes disposed on the display panel and a passivation layer covering the detection electrodes, in which the passivation layer includes a surface protrusion and depression portion overlapping the non-pixel area.

18 Claims, 8 Drawing Sheets

DISPLAY DEVICE WITH TOUCH SENSOR HAVING PROTRUSIONS AND DEPRESSIONS

CROSS-REFERENCE TO RELATED APPLICATION

This application claims priority from and the benefit of Korean Patent Application No. 10-2015-0049810 filed on Apr. 8, 2015, which is hereby incorporated by reference for all purposes as if fully set forth herein.

BACKGROUND

Field

Exemplary embodiments relate to a display device. More particularly, exemplary embodiments relate to a display device having a touch sensor embedded therein.

Discussion of the Background

A touch sensor may be an input device of a display device through which information may be input by touching a screen with a user's finger or a stylus. Among various detection types of the touch sensor, a capacitive type, in which two electrodes spaced apart from each other detect a position where capacitance is changed by a touch, has been widely used.

In a flexible display device, a display device may be formed thin, and to this end, the touch sensor may be embedded in the display device. An on-cell type touch sensor may not include a substrate therein and detection electrodes of the on-cell type touch sensor may be formed directly on a constituent element of the display device.

External light incident onto the display device may be reflected from an electrode of the display device (e.g., a common electrode of an organic light emitting device) and be mixed with light emitted from a pixel. When the display device is placed outside in the strong sunlight, reflected light thereof may be stronger than light emitted from the pixel, which may deteriorate visibility of a screen.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device including an on-cell type touch sensor that may improve touch sensitivity thereof and reduce reflection of external light to improve visibility when outdoors.

Additional aspects will be set forth in the detailed description which follows, and, in part, will be apparent from the disclosure, or may be learned by practice of the inventive concept.

An exemplary embodiment discloses a display device including a display panel including a substrate, a display unit including a pixel and a non-pixel area disposed on the substrate, and an encapsulation layer covering the display unit, and a touch sensor including detection electrodes disposed on the display panel, and a passivation layer covering the detection electrodes, in which the passivation layer includes a surface protrusion and depression portion overlapping the non-pixel area, and a touch sensor formed on the display panel.

An exemplary embodiment also discloses a method of forming a display device including forming a display unit on a substrate, the display unit including pixels and non-pixel areas disposed between the pixels, forming an encapsulation layer on the display unit, forming a first detection electrode on the encapsulation layer, the first detection electrode disposed in a first direction, forming a first passivation layer covering the first detection electrode and the encapsulation layer, forming a second detection electrode on the first passivation layer, the second detection electrode disposed in a second direction crossing the first direction, forming a second passivation layer covering the second detection electrode and the first passivation layer, and forming surface protrusion and depression portions on the second passivation layer, in which wherein the surface protrusion and depression portions overlap only the non-pixel areas.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
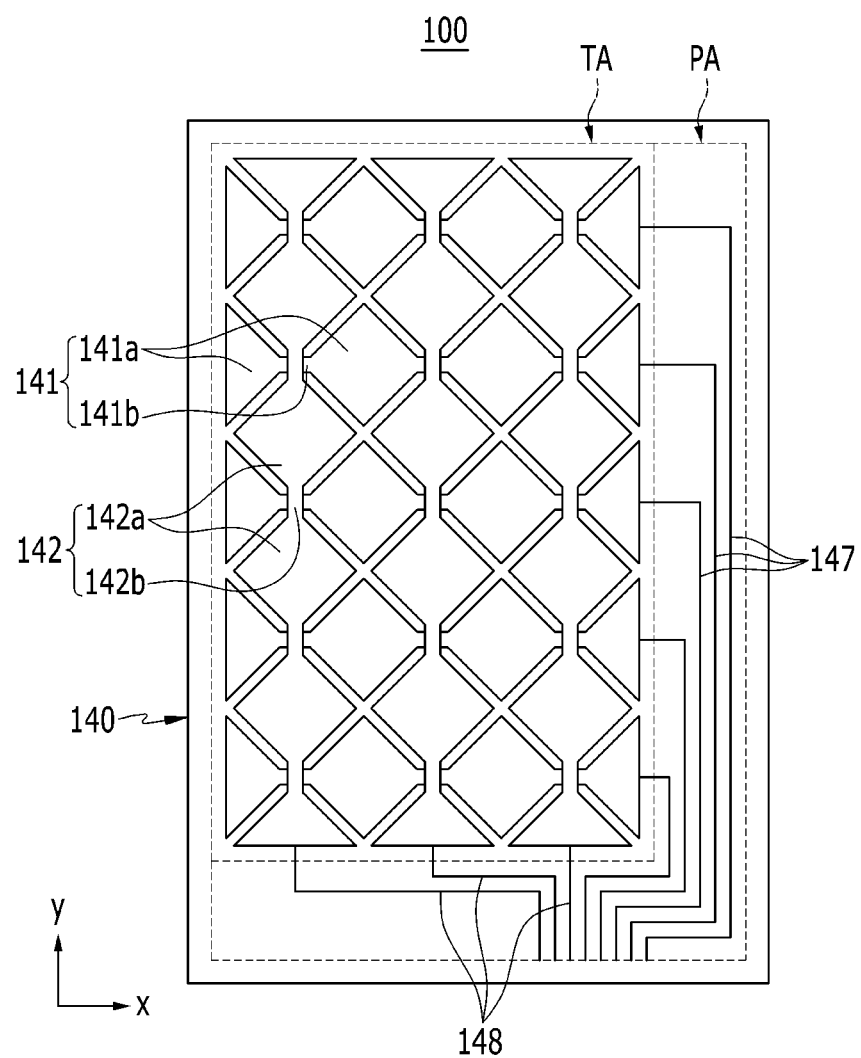
FIG. 1 is a schematic top plan view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
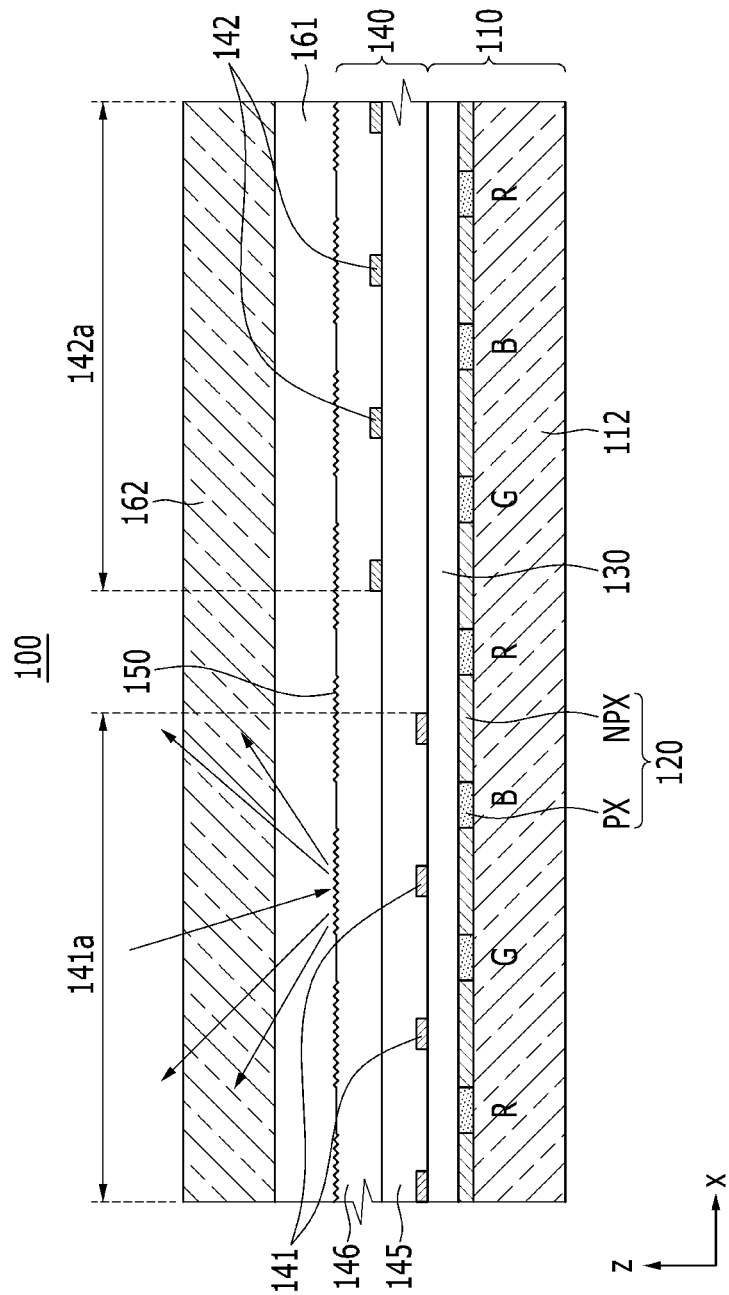
FIG. 2 is a schematic cross-sectional view of the display device illustrated in FIG. 1.
Figure 3:
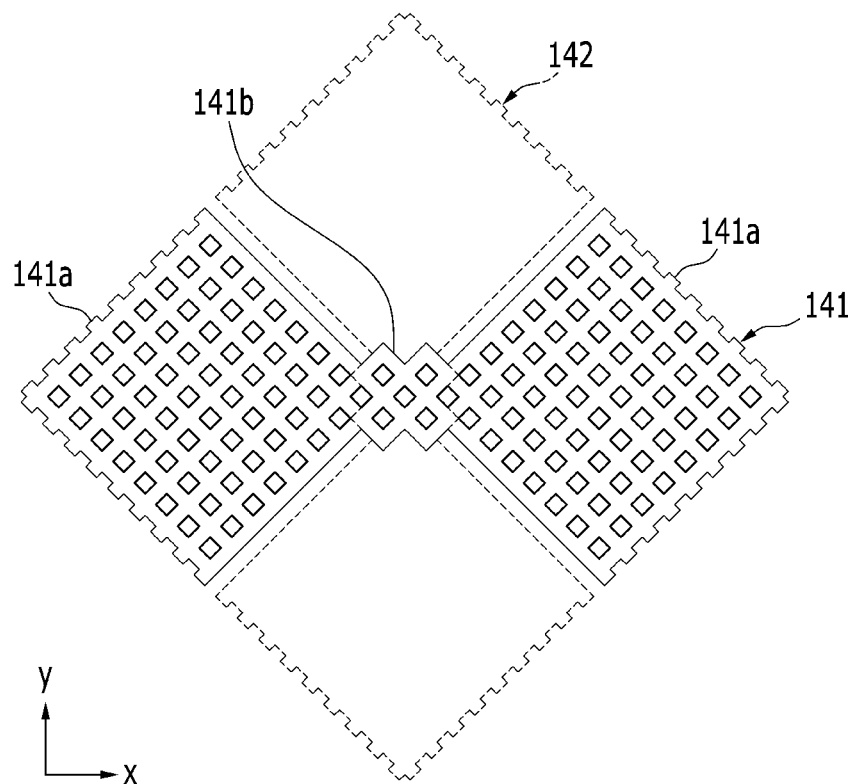
FIG. 3 is a partial top plan view of a first detection electrode of the display device of FIG. 2.
Figure 4:
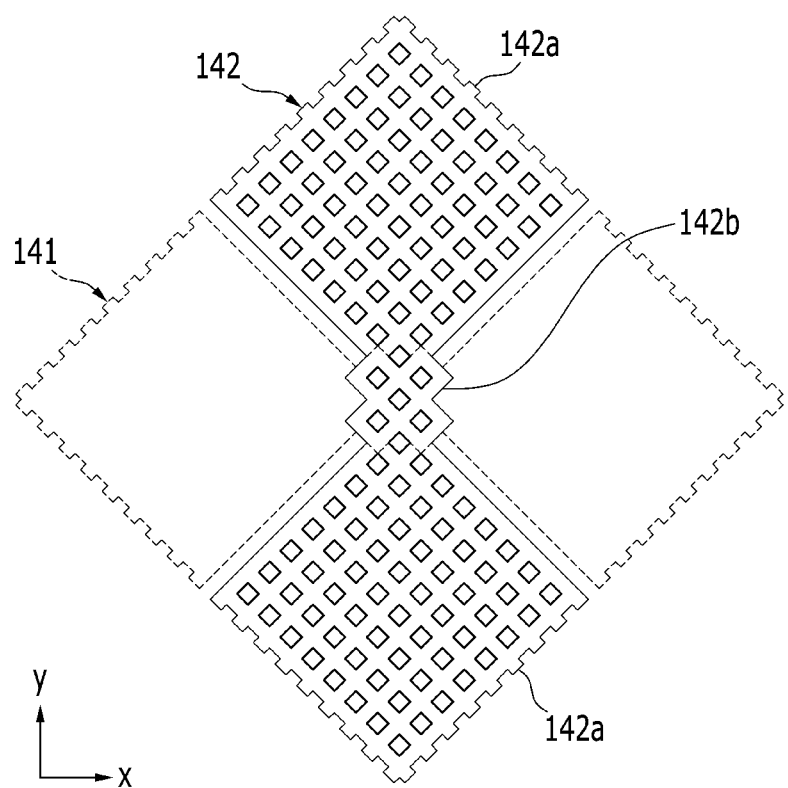
FIG. 4 is a partial top plan view of a second detection electrode of the display device of FIG. 2.

FIG. 1 is a schematic top plan view of a display device according to an exemplary embodiment. FIG. 2 is a schematic cross-sectional view of the display device of FIG. 1. FIG. 3 and FIG. 4 are partial top plan views of a first detection electrode and a second detection electrode of the display device of FIG. 2, respectively.

Referring to FIG. 1, FIG. 2, FIG. 3, and FIG. 4, a display device 100 according to an exemplary embodiment includes a display panel 110 displaying an image, and a touch sensor 140 formed on the display panel 110. The display device 100 may further include a transparent adhesive layer 161 and a cover window 162, which are formed on the touch sensor 140. The cover window 162 may protect the touch sensor 140 and the display panel 110 from external impact, scratches, and the like.

The display panel 110 includes a substrate 112, a display unit 120 formed on the substrate 112, and an encapsulation layer 130 sealing the display unit 120. The display unit 120 includes pixels PX spaced apart from each other, and displays an image by combining light emitted from the pixels PX. Spaces between the pixels PX are non-pixel areas NPX. The display unit 120 includes the pixels PX and the non-pixel areas NPX disposed between the pixels PX.

Figure 5:
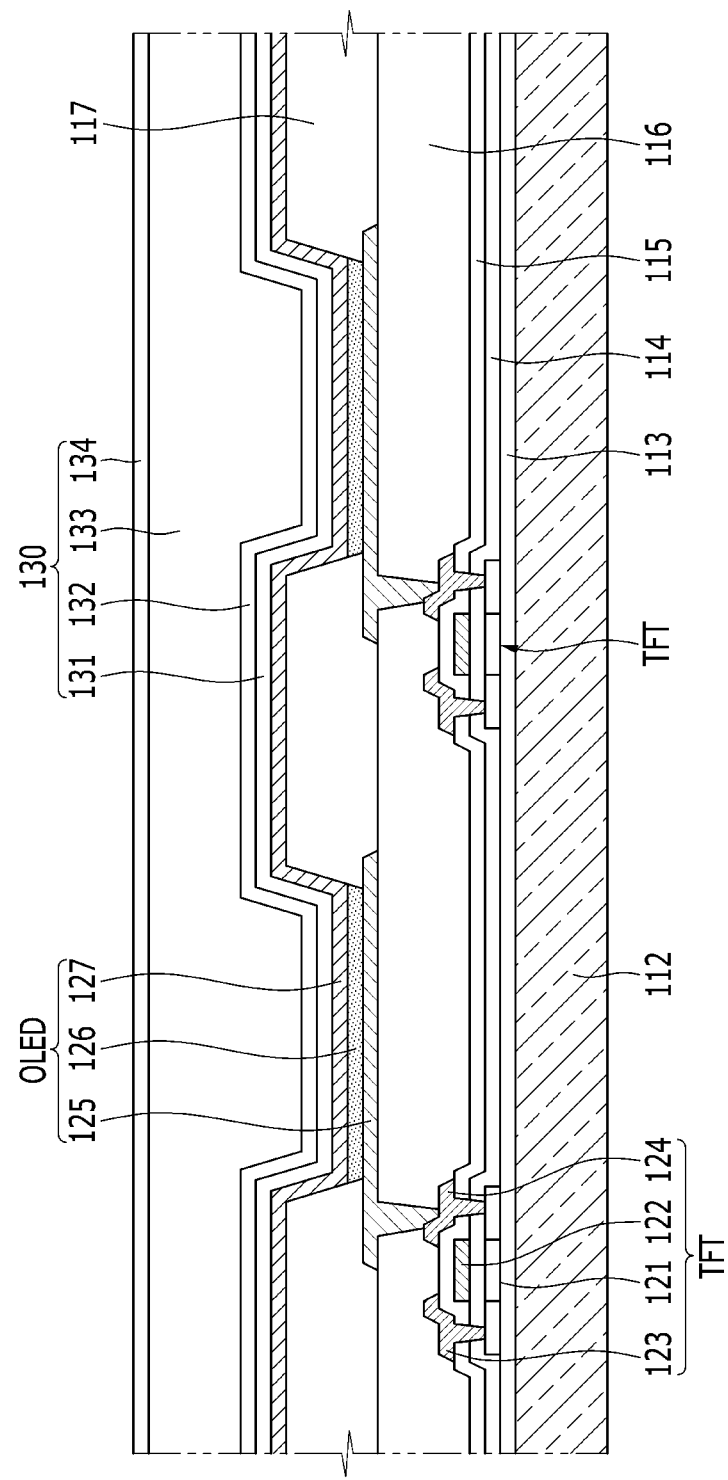
FIG. 5 is a partially enlarged cross-sectional view of an organic light emitting device according to an exemplary embodiment.

The display panel 110 may be an organic light emitting device. In the organic light emitting device, each pixel PX includes an organic light emitting diode and a driving circuit unit that may control light emission of the organic light emitting diode. The driving circuit unit includes at least two thin-film transistors and at least one capacitor. FIG. 5 is a partially enlarged cross-sectional view of an organic light emitting device.

Referring to FIG. 5, a buffer layer 113 is formed on the substrate 112, and a semiconductor layer 121 is formed on the buffer layer 113. The semiconductor layer 121 includes a channel region, which is not doped with impurities, and a source region and a drain region, which are disposed at both sides of the channel region and doped with impurities. A gate insulating layer 114 is formed on the semiconductor layer 121, and a gate electrode 122 is formed on the gate insulating layer 114. The gate electrode 122 overlaps the channel region of the semiconductor layer 121.

An interlayer insulating layer 115 is formed on the gate electrode 122, and a source electrode 123 and a drain electrode 124 are formed on the interlayer insulating layer 115. The source electrode 123 and the drain electrode 124 are connected to the source region and the drain region of the semiconductor layer 121, respectively, through via holes formed in the interlayer insulating layer 115 and the gate insulating layer 114. A thin-film transistor TFT illustrated in FIG. 5 may be a driving thin-film transistor and is covered with a planarization layer 116.

A pixel electrode 125 is formed on the planarization layer 116. The pixel electrode 125 is formed in each pixel, and connected to the drain electrode 124 of the driving thin-film transistor TFT through a via hole formed in the planarization layer 116. A pixel defined layer 117 is formed on the planarization layer 116 and the pixel electrode 125. The pixel defined layer 117 has an opening to expose the center of the pixel electrode 125 where an emission layer 126 is to be positioned.

The emission layer 126 is formed on the pixel electrode 125, and a common electrode 127 is formed on the emission layer 126 and the pixel defined layer 117. The common electrode 127 is formed on the entire display unit 120. Any one of the pixel electrode 125 and the common electrode 127 injects holes to the emission layer 126, and the other one of the pixel electrode 125 and the common electrode 127 injects electrons to the emission layer 126. The electrons and the holes are combined in the emission layer 126 to generate excitons, and light may be emitted by energy generated, when the excitons fall from an excited state to a ground state.

The pixel electrode 125 may be formed of a reflective layer, and the common electrode 127 may be formed of a transparent layer or a translucent layer. Light emitted from the emission layer 126 may be reflected from the pixel electrode 125 and penetrate the common electrode 127, to be released to the outside. In this case, when the common electrode 127 is formed of the translucent layer, a part of the light reflected from the pixel electrode 125 is re-reflected from the common electrode 127 to form a resonance structure, thereby enhancing light extraction efficiency.

Since the organic light emitting diode OLED may be highly vulnerable to moisture and oxygen, the encapsulation layer 130 seals the organic light emitting diode OLED to prevent external moisture and oxygen from permeating into the organic light emitting diode OLED. The encapsulation layer 130 may be configured as a multilayer of an inorganic layer and an organic layer. For example, the encapsulation layer 130 may include a capping layer 131, a first inorganic layer 132, an organic layer 133, and a second inorganic layer 134, which are sequentially stacked on the common electrode 127.

The capping layer 131 may include lithium fluoride (LiF), and the first inorganic layer 132 and the second inorganic layer 134 may include any one of aluminum oxide ($Al_2O_3$), silicon nitride ($SiN_x$), and silicon dioxide ($SiO_2$). The organic layer 133 may include any one of epoxy, acrylate, and urethane acrylate. The encapsulation layer 130 may have a very small thickness, such that a display device may be formed thin and be suitable for a flexible display device.

Referring back to FIG. 1, FIG. 2, FIG. 3, and FIG. 4, the touch sensor 140 includes detection electrodes 141 and 142 formed on the display panel 110, and passivation layers 145 and 146 covering the detection electrodes 141 and 142. The detection electrodes 141 and 142 may be formed in a mesh shape on the non-pixel areas NPX.

The detection electrodes 141 and 142 include first detection electrodes 141 formed in parallel to a first direction X, and second detection electrodes 142 formed in parallel to a second direction Y intersecting the first direction X. The first detection electrodes 141 are connected to first wirings 147, and the second detection electrodes 142 are connected to second wirings 148. The first detection electrodes 141 and the second detection electrodes 142 are formed in a touch area TA, and the first wirings 147 and the second wirings 148 are formed in a peripheral area PA outside the touch area TA.

The first detection electrode 141 may include first detection cells 141a having a substantially rhombus shape, and first connection portions 141b connecting the first detection cells 141a in the first direction X. The first detection electrode 141 may be a transmitter (Tx) touch electrode to which a first touch signal for detecting a coordinate value of the second direction Y is transmitted.

The second detection electrode 142 may include second detection cells 142a having a substantially rhombus shape, and second connection portions 142b connecting the second detection cells 142a in the second direction Y. The second detection electrode 142 may be a receiver (Rx) touch electrode to which a second touch signal for detecting a coordinate value of the first direction X is transmitted. The shapes of the first detection cells 141a and the second detection cells 142a may vary.

The first and second detection electrodes 141 and 142 may include a low resistance metal, such as silver (Ag), aluminum (Al), copper (Cu), chromium (Cr), and nickel (Ni), or a conductive nano-material, such as a silver nanowire and a carbon nanotube. The first and second detection electrodes 141 and 142 may have low resistance, to reduce a resistive-capacitive (RC) delay, and excellent flexibility, such that cracks may not be easily generated therein, even with repetitive deformation such as bending.

The first and second detection electrodes 141 and 142 are formed in the mesh shape on the non-pixel areas NPX, so as not to block the light emitted from the pixels PX and to reduce an area facing the common electrode 127 formed in the display panel 110, thereby reducing parasitic capacitance. Further, the touch sensor 140 may be disposed on the display panel 110 as a substrate, rather than being disposed in a separate substrate. Accordingly, the touch sensor 140 may have a very small thickness as a whole, such that the display device 100 may be formed thin and be suitable for a flexible display device.

The first detection electrode 141 and the second detection electrode 142 may be formed in different layers. For example, the first detection electrode 141 may be formed directly on the encapsulation layer 130 and covered with the first passivation layer 145. The second detection electrode 142 may be formed on the first passivation layer 145 and covered with the second passivation layer 146. In plan view, the first detection cell 141a and the second detection cell 142a are adjacent to each other, and the first connection portion 141b and the second connection portion 142b overlap each other, but the first connection portion 141b and the second connection portion 142b are insulated from each other by the first passivation layer 145.

The passivation layers 145 and 146 may include the first passivation layer 145 covering the first detection electrode 141, and the second passivation layer 146 covering the second detection electrode 142. The first passivation layer 145 and the second passivation layer 146 may be formed to have the same size as the touch area TA, and include an inorganic material, such as silicon nitride ($SiN_x$) or silicon oxide ($SiO_2$).

According to an exemplary embodiment, an arrangement of the first detection electrode 141 and the second detection electrode 142 may be changed with each other, in cross section of the display device 100. That is, the second detection electrode 142 may be formed directly on the encapsulation layer 130 and covered with the first passivation layer 145. The first detection electrode 141 may be formed on the first passivation layer 145 and covered with the second passivation layer 146.

The second passivation layer 146 includes surface protrusion and depression portions 150 that may diffuse and/or reflect external light. The surface protrusion and depression portion 150 is formed on the non-pixel areas NPX and includes depressions and protrusions having a size of several micrometers (μm). The surface protrusion and depression portion 150 may be formed by various methods, such as etching, blasting, and plasma surface treatment. The depressions and the protrusions may be arranged regularly or irregularly.

The surface protrusion and depression portion 150 may be formed to have a width larger than a width of the first and second detection electrodes 141 and 142 and smaller or equal to a width of the non-pixel areas NPX. For example, the surface protrusion and depression portions 150 may have a mesh shape and formed to correspond to the non-pixel areas NPX in the touch area TA. In the touch area TA, an area of all the surface protrusion and depression portions 150 may be about a half or more of an area of the touch area TA.

The surface protrusion and depression portion 150 may diffuse and/or reflect external light to be scattered, thereby reducing reflection of external light of the display device 100. That is, external light incident to non-pixel areas NPX of the display device 100 may be scattered from the surface protrusion and depression portion 150, such that an amount of light incident to the common electrode 127 may be reduced. When the passivation layer covering the detection electrodes 141 and 142 is configured as a multilayer including at least two layers, the surface protrusion and depression portion 150 may be formed on the uppermost layer of the multilayer.

In a conventional display device, which may not include the surface protrusion and depression portion 150, most of external light, except for the external light absorbed by the first and second detection electrodes 141 and 142, may be incident to the common electrode 127, reflected from the common electrode 127, and mixed with light emitted from the pixels PX. In this case, when the conventional display device is placed outside in the strong sunlight, the reflected light may be stronger than the light emitted from the pixels PX, which may deteriorate visibility of a screen.

According to an exemplary embodiment, the surface protrusion and depression portion 150 may scatter external light and reduce an amount of external light reaching the common electrode 127, thereby reducing an amount of external light reflected in the display device 100 as a whole, which may improve visibility of a screen. The surface protrusion and depression portion 150 may be formed on the non-pixel areas NPX, such that transmittance of light emitted from the pixels PX may not be lowered by the surface protrusion and depression portion 150.

Figure 6:
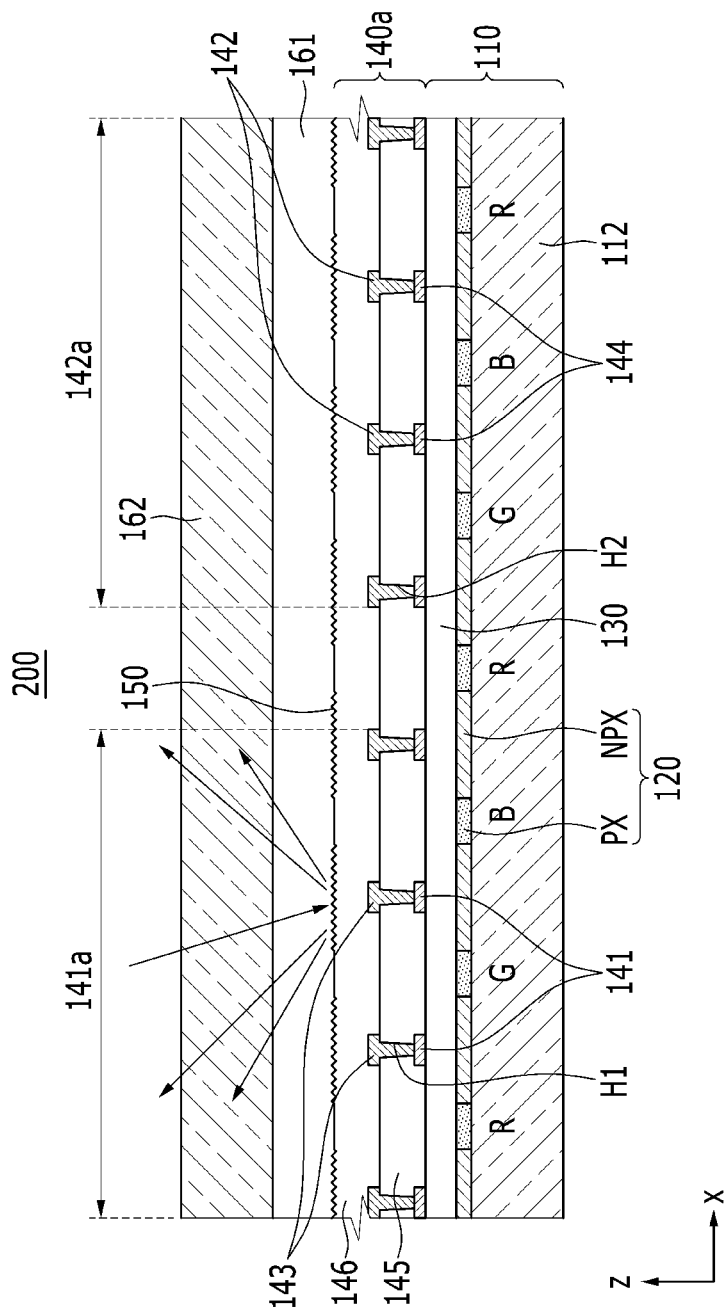
FIG. 6 is a schematic cross-sectional view of a display device according to an exemplary embodiment.
Figure 7:
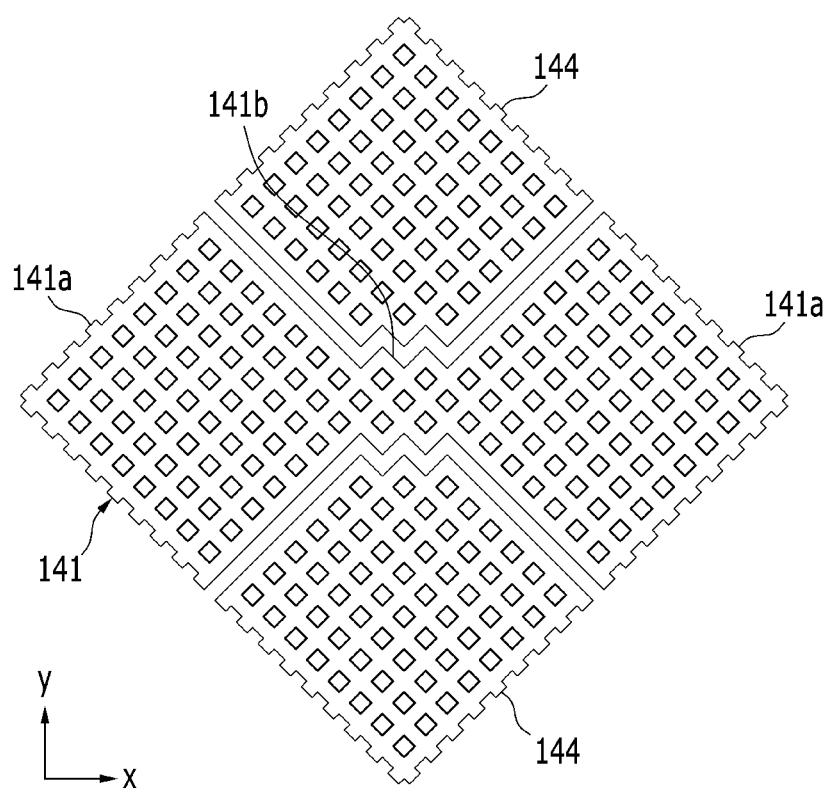
FIG. 7 is a partial top plan view of a first detection electrode and a second auxiliary electrode of the display device of FIG. 6.
Figure 8:
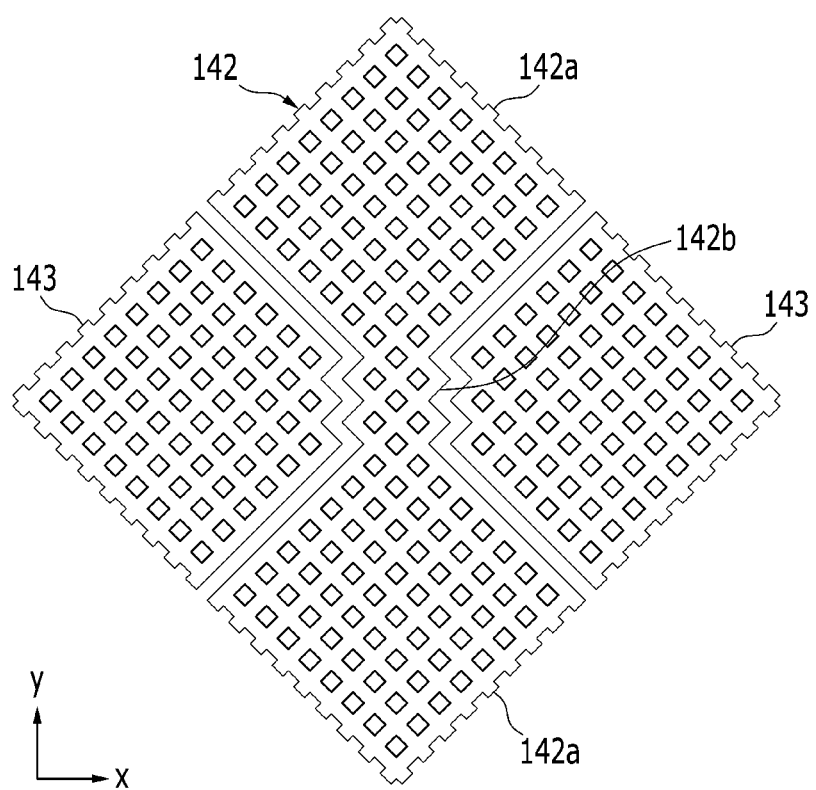
FIG. 8 is a partial top plan view of a second detection electrode and a first auxiliary electrode of the display device of FIG. 6.

FIG. 6 is a schematic cross-sectional view of a display device according to an exemplary embodiment. FIG. 7 is a partial top plan view of a first detection electrode and a second auxiliary electrode of the display device of FIG. 6. FIG. 8 is a partial top plan view of a second detection electrode and a first auxiliary electrode of the display device of FIG. 6.

Referring to FIG. 6, FIG. 7, and FIG. 8, a display device 200 according to an exemplary embodiment includes first auxiliary electrodes 143 overlapping first detection cells 141a and electrically connected to the first detection cells 141a, and second auxiliary electrodes 144 overlapping second detection cells 142a and electrically connected to the second detection cells 142a. The first auxiliary electrodes 143 and the second auxiliary electrodes 144 may be formed in a mesh shape on the non-pixel areas NPX. The display device 200 may have substantially similar constituting elements as those of the display device 100 illustrated with reference to FIG. 1, FIG. 2, FIG. 3, and FIG. 4, and thus, repeated description thereof will be omitted.

The second auxiliary electrodes 144 and the first detection electrodes 141 may be formed on the same layer and include the same material. The first auxiliary electrodes 143 and the second detection electrodes 142 may be formed on the same layer and include the same material.

More specifically, the first detection electrodes 141 and the second auxiliary electrodes 144 are formed on an encapsulation layer 130, and a first passivation layer 145 covers the first detection electrodes 141 and the second auxiliary electrodes 144. The second auxiliary electrodes 144 have an isolated cell shape between the first detection cells 141a, and may have a substantially rhombus shape.

The second detection electrodes 142 and the first auxiliary electrodes 143 are formed on the first passivation layer 145, and the second passivation layer 146 covers the second detection electrodes 142 and the first auxiliary electrodes 143. The first auxiliary electrodes 143 have an isolated cell shape between the second detection cells 142a, and may have a substantially rhombus shape. The shapes of the first detection cell 141a, the second detection cell 142a, the first auxiliary electrode 143, and the second auxiliary electrode 144 may vary.

The first auxiliary electrode 143 overlaps the first detection cell 141a, and the second detection cell 142a overlaps the second auxiliary electrode 144. A first contact hole H1, through which the first detection cell 141a contacts the first auxiliary electrode 143, may be formed on the first passivation layer 145, such that the first detection cell 141a is electrically connected to the first auxiliary electrode 143. Further, a second contact hole H2, through which the second auxiliary electrode 144 contacts the second detection cell 142a, may be formed on the first passivation layer 145, such that the second auxiliary electrode 144 is electrically connected to the second detection cell 142a.

Line resistance of each of the first and second detection electrodes 141 and 142 may be reduced by the first and second auxiliary electrodes 143 and 144, thereby lowering an RC delay. In addition, a second touch signal may flow in the second auxiliary electrode 144 adjacent to the first detection cell 141a, and a first touch signal may flow in the first auxiliary electrode 143 adjacent to the second detection cell 142a, such that an intensity of an electric field between the first detection cell 141a and the second detection cell 142a is increased, thereby increasing sensing sensitivity of the touch sensor 140a.

Thus, in an exemplary embodiment of the inventive concept, a surface protrusion and depression portion may scatter external light so that an amount of external light reaching a common electrode is reduced, thereby reducing an amount of external light reflected in a display device 100, which may improve visibility of a screen.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:
1. A display device, comprising:
a display panel comprising:
a substrate;
a display unit comprising a pixel and a non-pixel area disposed on the substrate; and
an encapsulation layer covering the display unit; and a touch sensor comprising:
    detection electrodes disposed on the display panel; and
    a passivation layer covering the detection electrodes,
    wherein the passivation layer comprises a surface protrusion and depression portion overlapping the non-pixel area, and,
    wherein a width of the surface protrusion and depression portion is greater than a width of each detection electrode, and is smaller than or equal to a width of the non-pixel area.

2. The display device of claim 1, wherein the surface protrusion and depression portion comprises depressions and protrusions having a size of several micrometers.

3. The display device of claim 1, wherein the detection electrodes have a mesh shape and are disposed on non-pixel areas.

4. The display device of claim 1, wherein:
    the touch sensor further comprises a touch area configured to sense a touch; and
    an area of the entire surface protrusion and depression portion is about half or more of the touch area.

5. The display device of claim 1, wherein:
    the passivation layer further comprises a multilayer; and
    the surface protrusion and depression portion is disposed on an uppermost layer of the multilayer.

6. The display device of claim 1, wherein:
    the pixel comprises an organic light emitting diode and a driving circuit unit; and
    the organic light emitting diode comprises a pixel electrode, an emission layer, and a common electrode.

7. The display device of claim 6, wherein:
    the encapsulation layer comprises a capping layer, a first inorganic layer, an organic layer, and a second inorganic layer sequentially disposed on the common electrode; and
    the detection electrodes are disposed directly on the encapsulation layer.

8. The display device of claim 1, wherein the detection electrodes comprise:
    a first detection electrode comprising first detection cells disposed in a first direction; and
    a second detection electrode comprising second detection cells disposed in a second direction crossing the first direction.

9. The display device of claim 8, wherein:
    the passivation layer further comprises a first passivation layer covering the first detection electrode and a second passivation layer covering the second detection electrode; and
    the second detection electrode is disposed on the first passivation layer.

10. The display device of claim 9, wherein the surface protrusion and depression portion is disposed on the second passivation layer.

11. The display device of claim 9, wherein:
    the touch sensor further comprises a first auxiliary electrode disposed on the first passivation layer, the first auxiliary electrode overlapping a first detection cell of the first detection cells; and
    the first passivation layer comprises a first contact hole through which the first detection cell is electrically connected to the first auxiliary electrode.

12. The display device of claim 11, wherein the first auxiliary electrode has an isolated cell shape and is spaced apart from the second detection electrode.

13. The display device of claim 12, wherein:
    the touch sensor further comprises a second auxiliary electrode overlapping a second detection cell of the second detection cells, the second auxiliary electrode disposed on the encapsulation layer; and
    the first passivation layer further comprises a second contact hole through which the second detection cell is electrically connected to the second auxiliary electrode.

14. The display device of claim 13, wherein the second auxiliary electrode has an isolated cell shape and is spaced apart from the first detection electrode.

15. The display device of claim 14, wherein:
    the first detection electrode and the second auxiliary electrode are disposed on the same layer and comprise the same material; and
    the second detection electrode and the first auxiliary electrode are disposed on the same layer and comprise the same material.

16. A method of forming a display device, the method comprising:
    forming a display unit on a substrate, the display unit comprising pixels and non-pixel areas disposed between the pixels;
    forming an encapsulation layer on the display unit;
    forming a first detection electrode on the encapsulation layer, the first detection electrode disposed in a first direction;
    forming a first passivation layer covering the first detection electrode and the encapsulation layer;
    forming a second detection electrode on the first passivation layer, the second detection electrode disposed in a second direction crossing the first direction;
    forming a second passivation layer covering the second detection electrode and the first passivation layer; and
    forming surface protrusion and depression portions on the second passivation layer,
    wherein the surface protrusion and depression portions overlap only the non-pixel areas, and
    wherein a width of each surface protrusion and depression portion is greater than a width of each of the first and second detection electrodes and smaller or equal to a width of each non-pixel areas.

17. The method of claim 16, further comprising:
    forming a second auxiliary electrode on the encapsulation layer; and
    forming a first auxiliary electrode on the first passivation layer; and
    forming a first contact hole and a second contact hole penetrating the first passivation layer; and
    electrically connecting the first detection electrode to the second auxiliary electrode via the first contact hole and the second detection electrode to the first auxiliary electrode via the second contact hole.

18. The method of claim 17, wherein:
    the first auxiliary electrode and the second detection electrode overlap each other and comprise the same material; and
    the second auxiliary electrode and the first detection electrode overlap each other and comprise the same material.

* * * * *